(12) United States Patent
Peng

(10) Patent No.: US 11,271,093 B2
(45) Date of Patent: Mar. 8, 2022

(54) MODIFIED REPAIR SOLUTION, PREPARATION METHOD THEREOF, AND METHOD FOR REPAIRING COLOR RESIST

(71) Applicant: TCL CHINA STAR OPTOELECTRONICS TECHNOLOGY CO., LTD., Shenzhen (CN)

(72) Inventor: Can Peng, Shenzhen (CN)

(*) Notice: Subject to any disclaimer, the term of this patent is extended or adjusted under 35 U.S.C. 154(b) by 302 days.

(21) Appl. No.: 16/627,297

(22) PCT Filed: Nov. 12, 2019

(86) PCT No.: PCT/CN2019/117457
§ 371 (c)(1),
(2) Date: Dec. 29, 2019

(87) PCT Pub. No.: WO2021/012505
PCT Pub. Date: Jan. 28, 2021

(65) Prior Publication Data
US 2021/0126111 A1    Apr. 29, 2021

(51) Int. Cl.
*H01L 29/66* (2006.01)
*C09D 7/63* (2018.01)
*C09D 5/08* (2006.01)

(52) U.S. Cl.
CPC .......... *H01L 29/66765* (2013.01); *C09D 5/08* (2013.01); *C09D 7/63* (2018.01)

(58) Field of Classification Search
CPC . G03F 7/40; G03F 7/422; G03F 7/425; H01L 21/0273; H01L 2251/568; H01L 21/31133; H01L 29/66765
See application file for complete search history.

(56) References Cited

U.S. PATENT DOCUMENTS

| 11,183,662 B1* | 11/2021 | Miao .................. H01L 51/5246 |
| 2015/0168827 A1* | 6/2015 | Yang .................... G02F 1/1335 430/280.1 |

\* cited by examiner

*Primary Examiner* — Jaehwan Oh

(57) ABSTRACT

The present invention provides a modified repair solution, a preparation method thereof, and a method for repairing color resist. Through adding additives to a photoresist solvent, a ketone compound in the modified repair solution is adsorbed on a surface of a source/drain metal layer to chemically react with a molecular linker to form a transparent colloid. The colloid is colorless and transparent, insoluble in water and organic solvent, and has strong adsorption with aluminum. After the transparent colloid is formed, further formation of the colloid is prevented, and aluminum is prevented from contacting with alkaline modified repair chemical solution, thereby preventing aluminum from being corroded; moreover, the chemical solution can be prevented from remaining in a damaged portion of a protective layer, and reaction with aluminum at high temperatures in post processing can be prevented, thereby preventing a vertical disconnection.

10 Claims, 2 Drawing Sheets

MODIFIED REPAIR SOLUTION, PREPARATION METHOD THEREOF, AND METHOD FOR REPAIRING COLOR RESIST

FIELD OF INVENTION

The invention relates to the field of display technology, and in particular, to a modified repair solution, a preparation method thereof, and a method for repairing color resist.

BACKGROUND OF INVENTION

At present, an overall trend of the panel industry adopts color filter on array (COA) technology. A main material of wires in small and medium-sized panels is still aluminum. However, in current aluminum processes for COA products, when repairing color resist, repair chemical solution ionizes a large number of hydroxyl groups (OH—) and they contact aluminum surface through damaged protective layer, leading to corrosion and breakage of aluminum. In addition, chemical solution remaining in the damaged site will corrode aluminum more severely under high temperatures (200-240° C.) in post processing, which is also a main cause of vertical disconnection. At present, an aluminum corrosion inhibitor is commonly used in the industry to prevent OH— from reacting with aluminum. This method can protect the metal when repairing the color resist, but under a high temperature in post processing, the inhibitor cannot prevent residual repair chemical solution from continuing to react with the aluminum, which causes vertical disconnection. Therefore, such method is currently not adopted in actual mass production by the industry.

Technical Problem

Therefore, it is urgent to provide a new modified repair solution for reducing the corrosion of the aluminum in source/drain metal layers, and further improving yield and stability of display panels.

SUMMARY OF INVENTION

An object of the present invention is to provide a modified repair solution, a preparation method thereof, and a method for repairing color resist. By adding an additive to the photoresist solvent, the ketone compound in the modified repair solution is adsorbed on a surface of the source/drain metal layer to chemically react with a molecular linker to form a transparent colloid, and prevent the aluminum from contacting the modified repair solution to prevent the aluminum from being corroded.

In order to achieve the above object, the present invention provides a modified repair solution including:

a photoresist solvent, additives, and a solvent, wherein the additives includes a ketone compound, a molecular linker, and a dispersant, the ketone compound has a structural formula of $R_2$—O—$R_3$—OH, and the molecular linker has a structural formula of HO—$R_4$—N—OH.

Further, the photoresist solvent has a structural formula of $R_1$—N—OH, and the solvent is water.

Further, each of $R_2$, $R_3$, and $R_4$ includes one of an alkyl group, an alkoxy group, or an aromatic group.

The invention also provides a preparation method of a modified repair solution, including the following steps: providing a photoresist solvent including a hydroxyl group and a nitrogen, additives, and a solvent, wherein the additives includes a ketone compound, a molecular linker, and a dispersant, the ketone compound has a structural formula of $R_2$—O—$R_3$—OH, and the molecular linker has a structural formula of HO—$R_4$—N—OH; putting the photoresist solvent and the additives into a container and performing ultrasonic dispersion at 50-60° C.; and adding the solvent to the container to form the modified repair solution; wherein the dispersant is used to dissolve the ketone compound in the solvent uniformly.

The invention further provides a method of repairing a color resist by a modified repair solution, including providing an array substrate and the modified repair solution according to claims 1 or 2, the array substrate is provided with a plurality of color resists, wherein the color resists include at least one defective color resist; adding the modified repair solution to the defective color resist to strip the defective color resist, and depositing a new color resist on a region of the array substrate corresponding to replace the defective color resist.

Further, the array substrate includes a source/drain metal layer and a protective layer, the protective layer is disposed on the source/drain metal layer, and material of the source/drain metal layer is aluminum.

Further, in the step of adding the modified repair solution to the defective color resist further includes: forming a crack in the protective layer; and contacting the modified repair solution with the source/drain metal layer through the crack, wherein the ketone compound in the modified repair solution is adsorbed on a surface of the source/drain metal layer and chemically reacts with the source/drain metal layer to form a transparent colloid, and the transparent colloid is used to block the modified repair solution from corroding the source/drain metal layer.

Further, the transparent colloid is insoluble in water, and the transparent colloid has a melting point of 280-330° C. and has a strong adsorption force with the aluminum.

Further, the transparent colloid has a structural formula of $R_4$—N—O—$R_3$—O—$R_2$.

Further, in the step of adding the modified repair solution to the defective color resist, and the additives in the modified repair solution are adsorbed on the surface of the source/drain metal layer to undergo a chemical reaction, in an alkaline environment at a reaction temperature of 60-80° C. And the aluminum acts as an activator.

Beneficial Effect

The present invention provides a modified repair solution, a preparation method thereof, and a method for repairing color resist. Through adding an additive to the photoresist solvent, the ketone compound in the modified repair solution is adsorbed on a surface of the source/drain metal layer to chemically react with a molecular linker to form a transparent colloid. The colloid is colorless and transparent, insoluble in water and organic solvent, and has strong adsorption with aluminum. After the transparent colloid is formed, on the one hand, the further formation of the colloid is prevented, and aluminum is prevented from contacting with the alkaline modified repair chemical solution, thereby preventing aluminum from being corroded; on the other hand, the chemical solution can be prevented from remaining in a damaged site of the protective layer, and the corrosion reaction with aluminum at high temperatures in post processing can be prevented, thereby preventing a vertical disconnection.

DESCRIPTION OF DRAWINGS

In order to more clearly illustrate the technical solutions in the embodiments of the present invention, the drawings used in the description of the embodiments will be briefly described below. It is obvious that the drawings described below are merely some embodiments of the present invention, other drawings can also be obtained by a person ordinarily skilled in the art based on these drawings without doing any creative activity.

Figure 1:
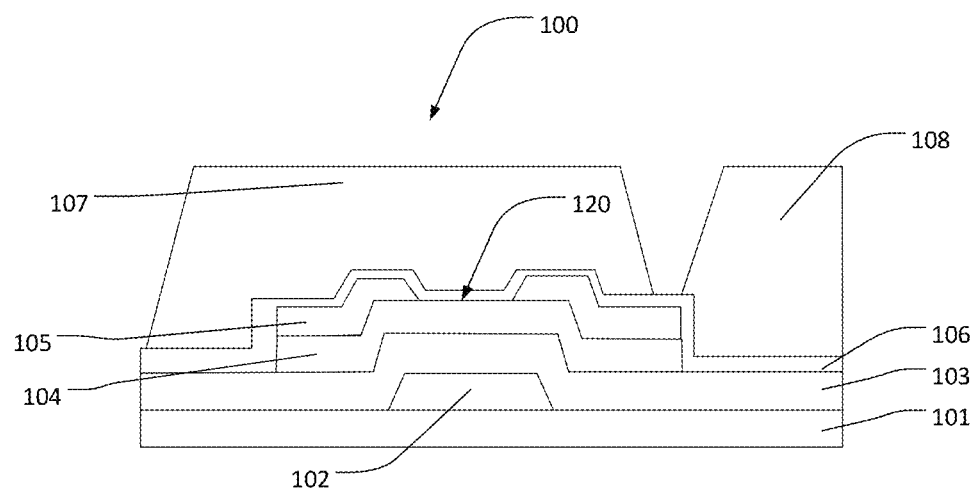
FIG. 1 is a schematic structural view of an array substrate provided by the present invention.

REFERENCE NUMERALS array substrate 100; glass substrate 101; gate metal layer 102; gate insulating layer 103; active layer 104; source/drain metal layer 105; protective layer 106; defective color resist 107, 108; crack 109; ketone compound 11; molecular linker 12; transparent colloid 110.

DETAILED DESCRIPTION OF PREFERRED EMBODIMENTS

The following description of the various embodiments is intended to illustrate specific embodiments of the invention. The directional terms mentioned in the present invention, such as upper, lower, front, back, left, right, inside, outside, side, etc., are merely directions referring to the drawings. The names of the components mentioned in the present invention, such as first, second, etc., are only used for distinguishing different components and better expressing. In the drawings, structurally similar components are denoted by the same reference numerals.

Embodiments of the present invention will be described in detail herein with reference to the drawings. The present invention may be expressed in many different forms and the invention is not to be construed as being limited to the specific embodiments set forth herein. The embodiments of the present invention are provided to explain the practical application of the present invention so that those skilled in the art can understand various embodiments of the present invention and various modifications suitable for the particular intended application.

The invention provides a modified repair solution, including a photoresist solvent, additives, and a solvent. The solvent is water.

Wherein, the photoresist solvent has a structural formula of $R_1$—N—OH; and the group $R_1$ includes one of an alkyl group, an alkoxy group, or an aromatic group.

The additives include a ketone compound, a molecular linker, and a dispersant. The ketone compound has a structural formula of $R_2$—O—$R_3$—OH; the groups $R_2$ and $R_3$ include one of an alkyl group, an alkoxy group, or an aromatic group.

The molecular linker has a structural formula of HO—$R_4$—N—OH; the group $R_4$ includes one of an alkyl group, an alkoxy group, or an aromatic group.

In order to more clearly explain the present invention, the modified repair solution is further explained below in conjunction with a preparation method of the modified repair solution of the present invention.

In one embodiment of the present invention, a preparation method of the modified repair solution of the present invention is described in detail by taking the modified repair solution of the present invention as an example.

The present invention also provides a preparation method of a modified repair solution, including following steps:

In step 1, providing a photoresist solvent, including a hydroxyl group and nitrogen, a solvent, and additives.

The photoresist solution has a structural formula of $R_1$—N—OH; the group $R_1$ includes one of an alkyl group, an alkoxy group, or an aromatic group. The additives include a ketone compound, a molecular linker, and a dispersant. The ketone compound has a structural formula of R—O—$R_3$—OH. The groups $R_2$ and $R_3$ include one of an alkyl group, an alkoxy group, or an aromatic group. The molecular linker has the structural formula of HO—$R_4$—N—OH; and the group $R_4$ includes one of an alkyl group, an alkoxy group, or an aromatic group.

In step 2, placing the photoresist solvent and the additives in a container and ultrasonically dispersing at 50 to 60° C.

In step 3: adding the solvent to the container to form the modified repair solution; wherein the dispersant is used to uniformly dissolve the ketone compound in the solvent.

In order to explain an application of the modified repair solution of the present invention, the present invention further provides an embodiment for explaining the application of the modified repair solution.

In one embodiment, the present invention provides a method for repairing color resist by the modified repair solution, including steps of:

S1, as shown in FIG. 1, an array of glass substrates 100 and the modified repair solution are provided. The array substrate 100 is provided with a plurality of color resists, wherein the color resists include at least one defective color resist. The numerals 107 and 108 of FIG. 1 both denote defective color resists. The defective color resist needs to be re-prepared to achieve a standard color resist. In the method for repairing the color resist by the modified repair solution of the present invention, the defective color resist denoted by 108 is first removed and re-prepared.

The array substrate 100 includes: a glass substrate 101, a gate metal layer 102, a gate insulating layer 103, an active layer 104, a source/drain metal layer 105, and a protective layer 106.

The gate metal layer 102 is disposed on the glass substrate 101.

The gate insulating layer 103 is disposed on the glass substrate 101 and the gate metal layer 102; the active layer 104 is disposed on the gate insulating layer 103. A material of the active layer 104 is polysilicon.

The source/drain metal layer 105 is disposed on the active layer 104, the source/drain metal layer 105 has a recess 120, and the recess 120 is recessed to a surface of the active layer 104.

The recess 120 causes a middle of the source/drain metal layer 105 to be in an open state. A material of the source/drain metal layer 105 is aluminum.

The protective layer 106 is disposed on the substrate 101 and the source/drain metal layer 105, and the protective layer 106 covers the recess 120. Specifically, the protective layer 106 can cover a bottom and a peripheral wall of the recess 120.

The photoresist solution has the structural formula of $R_1$—N—OH; the group $R_1$ includes one of an alkyl group, an alkoxy group, or an aromatic group. The additives include a ketone compound, a molecular linker, and a dispersant. The ketone compound has a structural formula of R—O—$R_3$—OH. The groups $R_2$ and $R_3$ include one of an alkyl group, an alkoxy group, or an aromatic group. The molecular linker has the structural formula of HO—$R_4$—N—OH; and the group $R_4$ includes one of an alkyl group, an alkoxy group, or an aromatic group.

Figure 2:
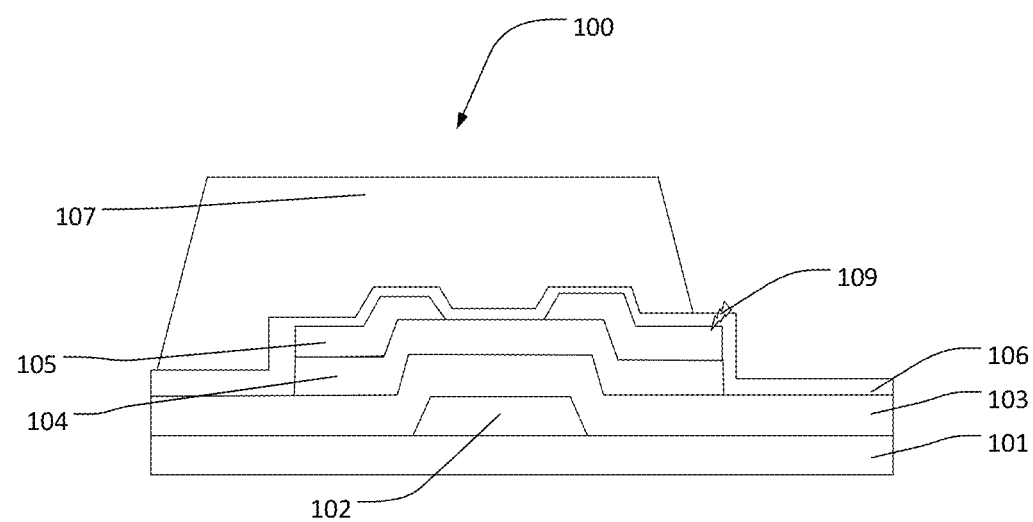
FIG. 2 is a schematic structural view showing a modified repair solution provided by the present invention destroying a protective layer.

S2, as shown in FIG. 2, the modified repair solution is dropped on the defective color resist 108 to strip the defective color resist 108.

The step of dropping the modified repair solution on the defective color resist further includes:

S21, forming a crack 109 in the protective layer 106, wherein the modified repair solution contacts the source/drain metal layer 105 through the crack 109.

Figure 3:
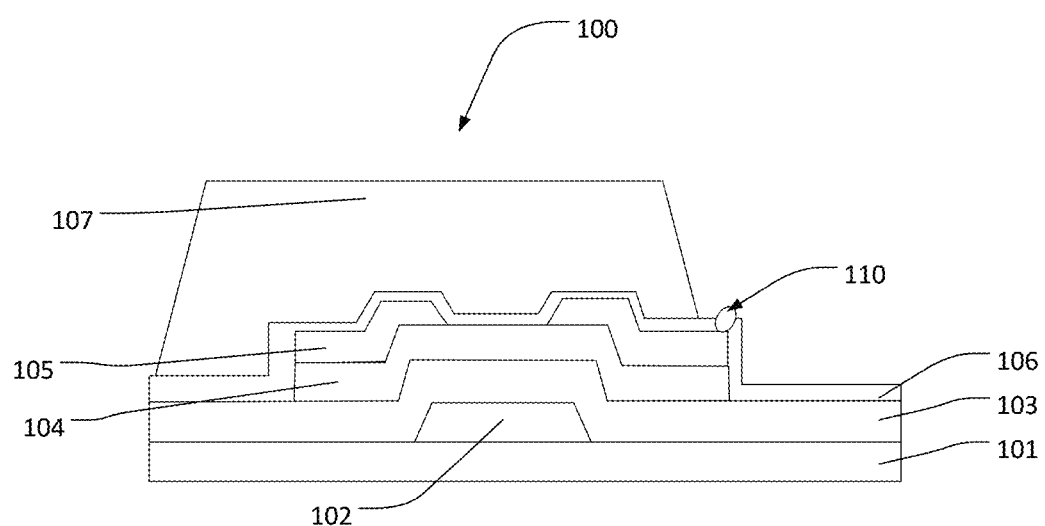
FIG. 3 is a schematic structural view of a transparent colloid filling provided by the present invention.

S22, as shown in FIG. 3, additives in the modified repair solution are adsorbed on a surface of the source/drain metal layer 105 to undergo a chemical reaction with the source/drain metal layer 105 to form a transparent colloid 110. The chemical reaction is an alkaline environment, the reaction temperature is 60-80° C., and the optimum temperature may be 70° C., 65° C., or 75° C.

Figure 4:
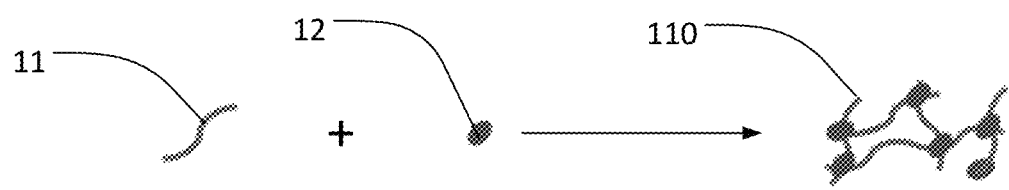
FIG. 4 is a chemical equation for forming a transparent colloid provided by the present invention.

As shown in FIG. 4, the transparent colloid 110 is obtained by reacting the ketone compound 11 and the molecular linker 12 under a condition that aluminum is used as a catalyst to prepare the transparent colloid 110. The transparent colloid 110 has the structural formula of $R_4$—N—O—$R_3$—O—$R_2$.

The transparent colloid 110 is used to block the modified repair solution from corroding the source/drain metal layer and filling the crack. On the other hand, the modified repair solution is prevented from remaining at the crack, and the corrosion reaction with aluminum at a high temperature of post processing is prevented, thereby preventing vertical disconnection.

The transparent colloid 110 is insoluble in water and an organic solvent, has a melting point of 280-330° C., and has a strong adsorption with aluminum.

S3, depositing a new color resist on a region of the array substrate corresponding to the defective color resist.

The additives of the present invention are added to the photoresist solvent, and the ketone compound in the modified repair solution is adsorbed on a surface of the source/drain metal layer to chemically react with the molecular linker to form a transparent colloid 110. The colloid is colorless and transparent, insoluble in water and organic solvent, and has strong adsorption with aluminum. After the transparent colloid 110 is formed, on the one hand, further formation of the colloid is prevented, and aluminum is prevented from contacting with the alkaline modified repair chemical solution, thereby preventing aluminum from being corroded; on the other hand, the chemical solution can be prevented from remaining in a damaged site of the protective layer, and the corrosion reaction with aluminum at high temperatures in post processing can be prevented, thereby preventing a vertical disconnection.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. A modified repair solution, comprising:
   a photoresist solvent, additives, and a solvent, wherein the additives comprise a ketone compound, a molecular linker, and a dispersant, the ketone compound has a structural formula of $R_2$—O—$R_3$—OH, and the molecular linker has a structural formula of HO—$R_4$—N—OH.

2. The modified repair solution according to claim 1, wherein the photoresist solvent has a structural formula of $R_1$—N—OH, and the solvent is water.

3. The modified repair solution according to claim 1, wherein each of $R_2$, $R_3$, and $R_4$ comprises one of an alkyl group, an alkoxy group, or an aromatic group.

4. A method for preparing a modified repair solution, comprising steps of:
   providing a photoresist solvent comprising a hydroxyl group and nitrogen, additives, and a solvent, wherein the additives comprise a ketone compound, a molecular linker, and a dispersant, the ketone compound has a structural formula of $R_2$—O—$R_3$—H, and the molecular linker has a structural formula of HO—$R_4$—N—OH;
   putting the photoresist solvent and the additives into a container and performing ultrasonic dispersion at 50-60° C.; and
   adding the solvent to the container to form the modified repair solution;
   wherein the dispersant is used to uniformly dissolve the ketone compound in the solvent.

5. A method for repairing a color resist by a modified repair solution, comprising:
   providing an array substrate and the modified repair solution according to claim 1, wherein the array substrate is provided with a plurality of color resists, and the color resists comprise at least one defective color resist;
   adding the modified repair solution to the at least one defective color resist to strip the at least one defective color resist; and
   depositing a new color resist on a region of the array substrate corresponding to the at least one defective color resist.

6. The method for repairing the color resist by the modified repair solution according to claim 5, wherein the array substrate comprises a source/drain metal layer and a protective layer, the protective layer is disposed on the source/drain metal layer, and a material of the source/drain metal layer is aluminum.

7. The method for repairing the color resist by the modified repair solution according to claim 6, wherein the step of adding the modified repair solution to the at least one defective color resist further comprises:
   forming a crack in the protective layer; and
   contacting the modified repair solution with the source/drain metal layer through the crack, wherein the ketone compound in the modified repair solution is adsorbed on a surface of the source/drain metal layer and chemically reacts with the source/drain metal layer to form a transparent colloid, and the transparent colloid is used to block the modified repair solution from corroding the source/drain metal layer.

8. The method for repairing the color resist by the modified repair solution according to claim 7, wherein the transparent colloid is insoluble in water, and the transparent colloid has a melting point of 280-330° C. and has a strong adsorption with aluminum.

9. The method for repairing the color resist by the modified repair solution according to claim 7, wherein the transparent colloid has a structural formula of $R_4$—N—O—$R_3$—O—$R_2$.

10. The method for repairing the color resist by the modified repair solution according to claim 6, wherein in the step of adding the modified repair solution to the at least one defective color resist, the additives in the modified repair solution are adsorbed on a surface of the source/drain metal layer to undergo a chemical reaction, and the chemical reaction is an alkaline environment at a reaction temperature of 60-80° C.

\* \* \* \* \*